United States Patent
Li et al.

(10) Patent No.: US 7,119,033 B2
(45) Date of Patent: *Oct. 10, 2006

(54) ION-ASSISTED OXIDATION METHODS AND THE RESULTING STRUCTURES

(75) Inventors: Li Li, Meridian, ID (US); Pai-Hung Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 193 days.

This patent is subject to a terminal disclaimer.

(21) Appl. No.: 10/880,886

(22) Filed: Jun. 30, 2004

(65) Prior Publication Data

US 2004/0266213 A1    Dec. 30, 2004

Related U.S. Application Data

(63) Continuation of application No. 09/934,916, filed on Aug. 22, 2001, now Pat. No. 6,770,538, which is a continuation of application No. 09/146,710, filed on Sep. 3, 1998, now Pat. No. 6,355,580.

(51) Int. Cl.
*H01L 21/31* (2006.01)
*H01L 21/3105* (2006.01)

(52) U.S. Cl. ........................ 438/771; 438/774; 438/773
(58) Field of Classification Search ................ 438/788, 438/798, 308, 770, 771, 773, 774, 787, 297, 438/298, 439, 440, 592; 148/DIG. 116, DIG. 118
See application file for complete search history.

(56) References Cited

U.S. PATENT DOCUMENTS

| | | |
|---|---|---|
| 3,849,276 A | 11/1974 | Greiner |
| 3,943,542 A | 3/1976 | Ho et al. |
| 4,351,712 A | 9/1982 | Cuomo et al. |
| 4,652,463 A | 3/1987 | Peters |
| 4,776,925 A | 10/1988 | Fossum et al. |
| 4,784,975 A | 11/1988 | Hofmann et al. |
| 4,864,375 A | 9/1989 | Teng et al. |
| 4,902,647 A | 2/1990 | Chutjian et al. |
| 4,945,867 A | 9/1990 | Hosaka |
| 4,997,746 A | 3/1991 | Greco et al. |
| 5,146,291 A | 9/1992 | Watabe et al. |
| 5,183,775 A | 2/1993 | Levy |
| 5,210,056 A | 5/1993 | Pong et al. |
| 5,219,773 A | 6/1993 | Dunn |
| 5,279,978 A | 1/1994 | See et al. |
| 5,344,793 A | 9/1994 | Zeininger et al. |
| 5,349,467 A | 9/1994 | Sulzbach et al. |

(Continued)

OTHER PUBLICATIONS

P. Osiceanu et al., "An ESCA Study on Ion Beam Included Oxidation of Si", 1995 IEEE, pp. 159-162.

(Continued)

*Primary Examiner*—M. Wilczewski
(74) *Attorney, Agent, or Firm*—TraskBritt

(57) ABSTRACT

Oxidation methods and resulting structures including providing an oxide layer on a substrate and then re-oxidizing the oxide layer by vertical ion bombardment of the oxide layer in an atmosphere containing at least one oxidant. The oxide layer may be provided over diffusion regions, such as source and drain regions, in a substrate. The oxide layer may overlie the substrate and is proximate a gate structure on the substrate. The at least one oxidant may be oxygen, water, ozone, or hydrogen peroxide, or a mixture thereof. These oxidation methods provide a low-temperature oxidation process, less oxidation of the sidewalls of conductive layers in the gate structure, and less current leakage to the substrate from the gate structure.

30 Claims, 2 Drawing Sheets

U.S. PATENT DOCUMENTS

| | | |
|---|---|---|
| 5,382,820 A | 1/1995 | Yang et al. |
| 5,387,546 A | 2/1995 | Maeda et al. |
| 5,427,962 A | 6/1995 | Sasaki et al. |
| 5,436,481 A | 7/1995 | Egawa et al. |
| 5,508,368 A | 4/1996 | Knapp et al. |
| 5,521,126 A | 5/1996 | Okamura et al. |
| 5,527,718 A | 6/1996 | Seita et al. |
| 5,536,679 A | 7/1996 | Park |
| 5,702,849 A | 12/1997 | Sakata et al. |
| 5,723,896 A | 3/1998 | Yee et al. |
| 5,759,900 A | 6/1998 | Suh |
| 5,811,326 A | 9/1998 | Yamamoto |
| 5,836,772 A | 11/1998 | Chang et al. |
| 5,847,427 A | 12/1998 | Hagiwara |
| 5,885,877 A | 3/1999 | Gardner et al. |
| 5,915,190 A | 6/1999 | Pirkle |
| 5,930,617 A | 7/1999 | Wu |
| 5,965,926 A | 10/1999 | Schwalke |
| 6,010,936 A | 1/2000 | Son |
| 6,022,794 A | 2/2000 | Hsu |
| 6,037,639 A | 3/2000 | Ahmad |
| 6,097,062 A | 8/2000 | Gardner et al. |
| 6,097,069 A | 8/2000 | Brown et al. |
| 6,110,278 A | 8/2000 | Saxena |
| 6,110,794 A | 8/2000 | Liu |
| 6,124,216 A | 9/2000 | Ko |
| 6,127,248 A | 10/2000 | Kim |
| 6,198,142 B1 | 3/2001 | Chau et al. |
| 6,221,743 B1 | 4/2001 | Fujikawa et al. |
| 6,306,712 B1 | 10/2001 | Rodder et al. |
| 6,355,580 B1 * | 3/2002 | Li et al. ............... 438/788 |
| 6,429,496 B1 * | 8/2002 | Li et al. ............... 257/411 |
| 6,559,027 B1 | 5/2003 | Ishitsuka et al. |
| 6,566,703 B1 | 5/2003 | Liang et al. |
| 6,770,538 B1 * | 8/2004 | Li et al. ............... 438/297 |
| 2002/0048888 A1 * | 4/2002 | Li et al. ............... 438/297 |
| 2002/0158285 A1 | 10/2002 | Clementi et al. |
| 2002/0175382 A1 * | 11/2002 | Li et al. ............... 257/369 |
| 2004/0266213 A1 * | 12/2004 | Li et al. ............... 438/770 |
| 2005/0277259 A1 * | 12/2005 | Takami ............... 438/300 |

OTHER PUBLICATIONS

Watanabe, Jinzo, et al., "Ultra Low-Temperature Growth of High-Integrity Thin Gate Oxide Films by Low-Energy Ion-Assisted Oxidation," Jpn. J. Appl. Phys., vol. 34 (Feb. 1995), pp. 900-902.

* cited by examiner

ION-ASSISTED OXIDATION METHODS AND THE RESULTING STRUCTURES

CROSS-REFERENCE TO RELATED APPLICATIONS

This application is a continuation of application Ser. No. 09/934,916, filed Aug. 22, 2001, now U.S. Pat. No. 6,770, 538, issued Aug. 3, 2004, which is a continuation of application Ser. No. 09/146,710, filed Sep. 3, 1998, now U.S. Pat. No. 6,355,580, issued Mar. 12, 2002.

BACKGROUND OF THE INVENTION

This invention relates generally to the field of integrated circuit design and fabrication. Specifically, the invention relates to ion-assisted oxidation methods and the structures formed thereby.

Silicon oxide is used in integrated circuit (IC) and semiconductor fabrication, especially metal-oxide-semiconductor (MOS) fabrication, due to its excellent dielectric properties for insulation and field enhancement. See, for example, U.S. Pat. Nos. 4,776,925 and 5,521,126, the disclosures of which are incorporated herein by reference. Silicon oxide, both doped and undoped, is especially useful for fabrication of transistors. A transistor is typically fabricated by growing a gate structure containing a gate dielectric and a gate conductor on the surface of a silicon substrate, followed by forming source and drain regions in portions of the substrate flanking the gate structure. Unfortunately, the gate dielectric will be etched partially during the dry etch of the gate conductor. A thinner gate dielectric along the gate conductor edge will degrade the gate dielectric intensity and increase the gate-induced drain leakage. In order to eliminate these problems, the gate dielectric needs to be re-grown.

A high-temperature (greater than about 700° C.) oxidation is often used in the IC industry to re-grow the gate dielectric. High-temperature oxidation, however, can cause problems such as changes in impurity profiles, non-uniform oxide thicknesses along the side wall of the gate conductor, and defect formation in the underlying substrate. When certain metals, such as tungsten, are used as the gate conductor, a high-temperature oxidation process can form materials, such as tungsten oxide, that are volatile and can cause product yield loss.

Different oxidation techniques, such as plasma oxidation and anodization, have been proposed to reduce the temperature necessary to re-grow gate dielectrics. Most of these low-temperature techniques, however, fail to produce the high-quality gate dielectric necessary to maintain good gate dielectric integrity and low leakage.

SUMMARY OF THE INVENTION

The present invention provides methods of oxidization using vertical ion bombardment in an oxidant-containing atmosphere. Specifically, the present invention forms an oxide layer on source and drain regions of a substrate by re-oxidizing an oxide layer previously formed thereon. The re-oxidation is performed by vertically bombarding the previously formed oxide layer with inert ions in an atmosphere containing at least one oxidant.

The present invention includes an oxidation method which provides an oxide layer on a substrate and then re-oxidizes the oxide layer by vertical ion bombardment in an atmosphere containing at least one oxidant. The oxide layer may be provided over diffusion regions, such as source and drain regions, in a substrate. The oxide layer may also flank a gate structure provided on the substrate. The at least one oxidant may be oxygen, water, ozone, hydrogen peroxide, or a mixture thereof. The atmosphere may also contain hydrogen. The ion bombardment may use krypton (Kr), helium (He), or argon (Ar) ions, at a temperature ranging from about 25° C. to about 700° C., at an energy ranging from about 100 to about 300 eV, and for a time ranging from about 5 minutes to about 500 minutes.

The present invention permits a high-quality thin oxide layer to be formed at relatively low temperatures when compared with conventional techniques. Low-temperature oxidation leads to fewer thermal stresses, fewer crystal defects, less wafer warpage, and reduction of oxidation-enhanced diffusion. The present invention also allows less oxidation of the sidewalls of conductive layers in transistor gate structures to occur during oxidation. The present invention also facilitates fabrication of a transistor exhibiting lower amounts of current leakage to source and drain regions during operation.

BRIEF DESCRIPTION OF THE DRAWINGS

The figures presented in conjunction with this description are not actual views of any particular portion of an actual semiconductor device or component, but are merely representations employed to clearly and fully depict the present invention.

DETAILED DESCRIPTION OF THE INVENTION

The present invention provides ion-assisted oxidation methods and the structures formed thereby. The ion-assisted oxidation methods are employed to form a high-quality oxide layer over source and drain regions of a substrate. The ion-assisted oxidation methods form this high-quality oxide layer when inert ions, such as argon, vertically bombard a pre-existing oxide layer on the substrate or structures thereof in an atmosphere containing at least one oxidant, thereby increasing the quality and thickness of the pre-existing oxide layer. The energy for forming the high-quality oxide layer comes from the energy of the inert ions, rather than a high temperature.

The following description provides specific details such as material thicknesses and types in order to provide a thorough understanding of the present invention. The skilled artisan, however, would understand that the present invention may be practiced without employing these specific details. Indeed, the present invention can be practiced in conjunction with fabrication techniques conventionally used in the industry.

The process steps and structures described below do not form a complete process flow for manufacturing IC devices, the remainder of which is known to those of ordinary skill in the art. Accordingly, only the process steps and structures necessary to understand the present invention are described.

FIGS. 1–4 illustrate the steps of one exemplary ion-assisted oxidation process according to the present invention and the resulting structure. It will be understood, however, by those skilled in the art that other oxidation processes and structures could be formed by slight modifications of the illustrated method.

Figure 1:
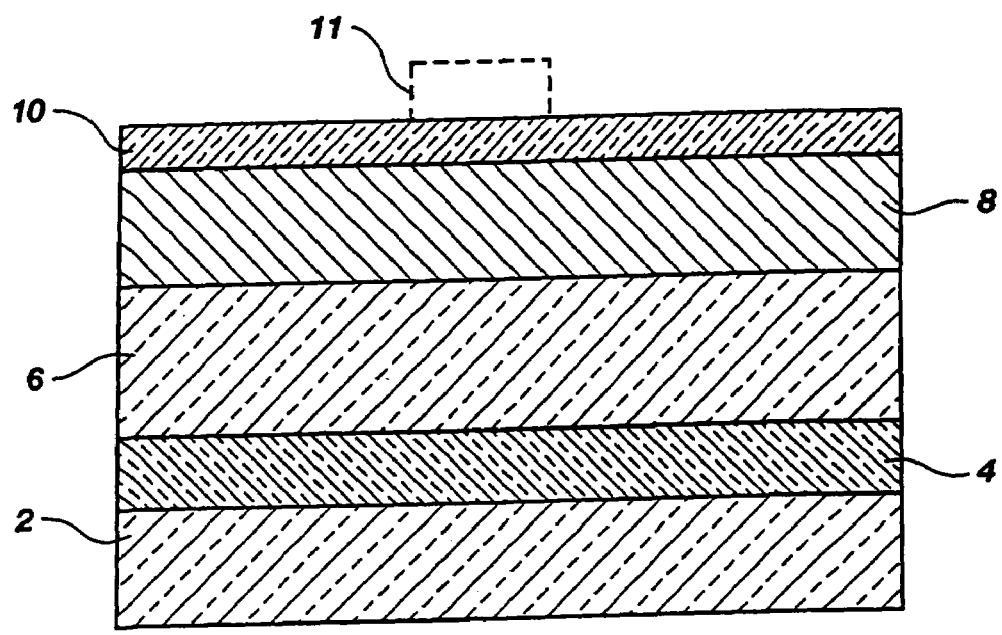
FIGS. 1–4 are cross-sectional side views of steps of one exemplary ion-assisted oxidation process according to the present invention and the resulting structure.

A preferred method of practicing the present invention is illustrated in FIG. 1. To begin, semiconductor substrate 2 is first provided. Semiconductor substrate 2 may be any surface suitable for device formation, such as a semiconductor wafer, and may be doped and/or include an epitaxial layer. Preferably, semiconductor substrate 2 is a silicon wafer or a bulk silicon region, such as a silicon-on-insulator or silicon-on-sapphire structure.

Dielectric layer 4 is then formed over semiconductor substrate 2. Dielectric layer 4 isolates the overlying gate electrode, as described below, from the upper surface of semiconductor substrate 2. Accordingly, any suitable dielectric material can be employed as dielectric layer 4, such as undoped or doped silicon oxide, boron- and/or phosphorous-doped silicate glass, silicon oxynitride, silicon nitride, or a composite layer containing these materials. Preferably, dielectric layer 4 is a silicon oxide layer formed by a suitable thermal oxidation process, such as oxidizing the preferred silicon substrate 2 in an atmosphere containing oxygen for about 60 to about 200 minutes at about 750 to about 950° C.

Next, conductive layer 6 is deposited. Since conductive layer 6 will form the gate electrode, any suitable gate electrode material may be employed. Preferably, conductive layer 6 is a doped polysilicon layer. Preferred polysilicon layer 6 may be formed by any suitable deposition method known in the art, such as physical or chemical vapor deposition. Preferably, preferred polysilicon layer 6 is deposited by low-pressure chemical vapor deposition (LPCVD) to a thickness ranging from about 1000 to about 5000 angstroms. Preferred polysilicon layer 6 can be in-situ doped during deposition by including a gas containing the desired dopant in the deposition atmosphere. Second conductive layer 8 comprising a material with a lower resistance and lower melting point than the material of conductive layer 6 may optionally be deposited over conductive layer 6. When conductive layer 6 is doped polysilicon, second conductive layer 8 may be tungsten silicide, titanium silicide, a titanium nitride and tungsten mixture, a tungsten nitride and tungsten mixture, a titanium nitride and molybdenum mixture, or the like.

Second dielectric layer 10 may optionally be formed over conductive layer 6 or second conductive layer 8. Second dielectric layer 10 comprises any suitable dielectric material used in the art, such as undoped or doped silicon oxide, boron- and/or phosphorous-doped silicate glass, silicon oxynitride, silicon nitride, or a composite layer containing these materials. Preferably, second dielectric layer 10 comprises silicon oxide or silicon nitride. Second dielectric layer 10 may be formed by any suitable deposition process, such as LPCVD.

Figure 2:
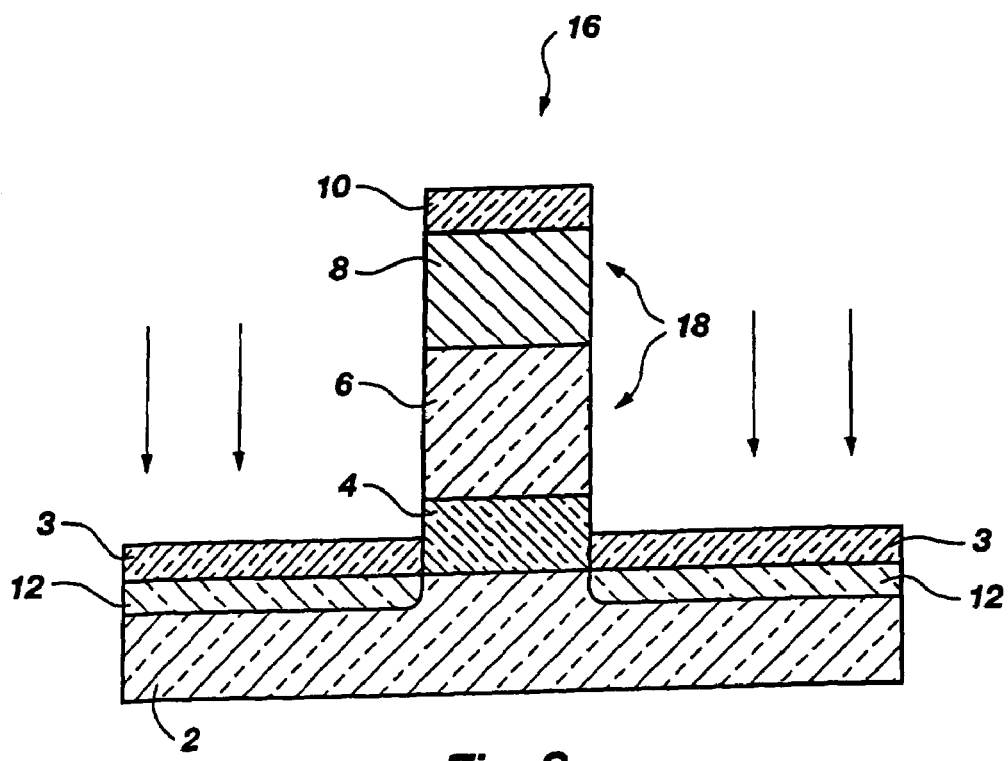

As depicted in FIG. 2, first dielectric layer 4, conductive layer 6, second conductive layer 8 (if present), and second dielectric layer 10 (if present) are then patterned and etched to form gate structure 16. Preferably, gate structure 16 is formed by a photolithographic pattern and etch process, such as depositing a photoresist layer, developing portions thereof, and then removing the developed portions to form photoresist mask 11 (shown by the broken line in FIG. 1). First dielectric layer 4, conductive layer 6, second conductive layer 8 (if present), and second dielectric layer 10 (if present) are then anisotropically etched by any process in the art to remove undesired portions of the layers. During the pattern and etch process, not all of dielectric layer 4 above semiconductor substrate 2 need be removed. When dielectric layer 4 is silicon oxide, an oxide layer 3 of reduced thickness preferably remains after etching, even though it is possible to remove all of dielectric layer 4. The thickness of oxide layer 3 is approximately half the thickness of the initial dielectric layer 4, i.e., if the thickness of dielectric layer 4 was initially about 100 angstroms, the thickness of oxide layer 3 would be about 50 angstroms. After the pattern and etch process is complete, photoresist mask 11 is removed by any suitable process known in the art.

Diffusion regions 12, such as source/drain regions, are then formed in semiconductor substrate 2. Diffusion regions 12 can be formed by any suitable process known in the art, such as by doping or ion implanting a suitable dopant, such as B, As, or P, through oxide layer 3 at an energy and dose sufficient to form the desired dopant concentration and profile.

Figure 3:
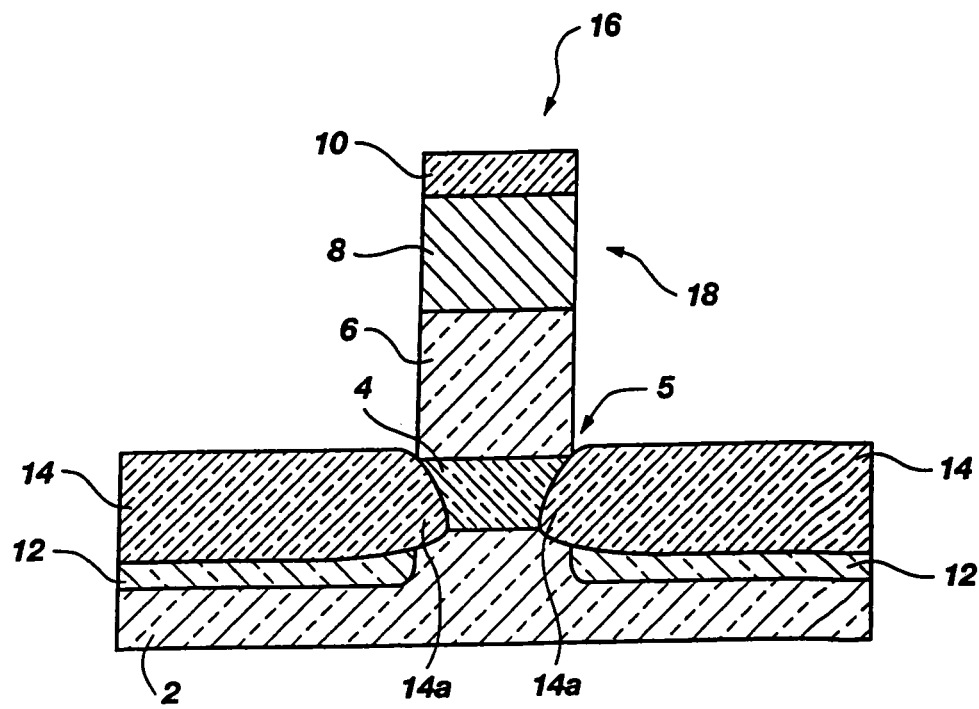
Figure 4:
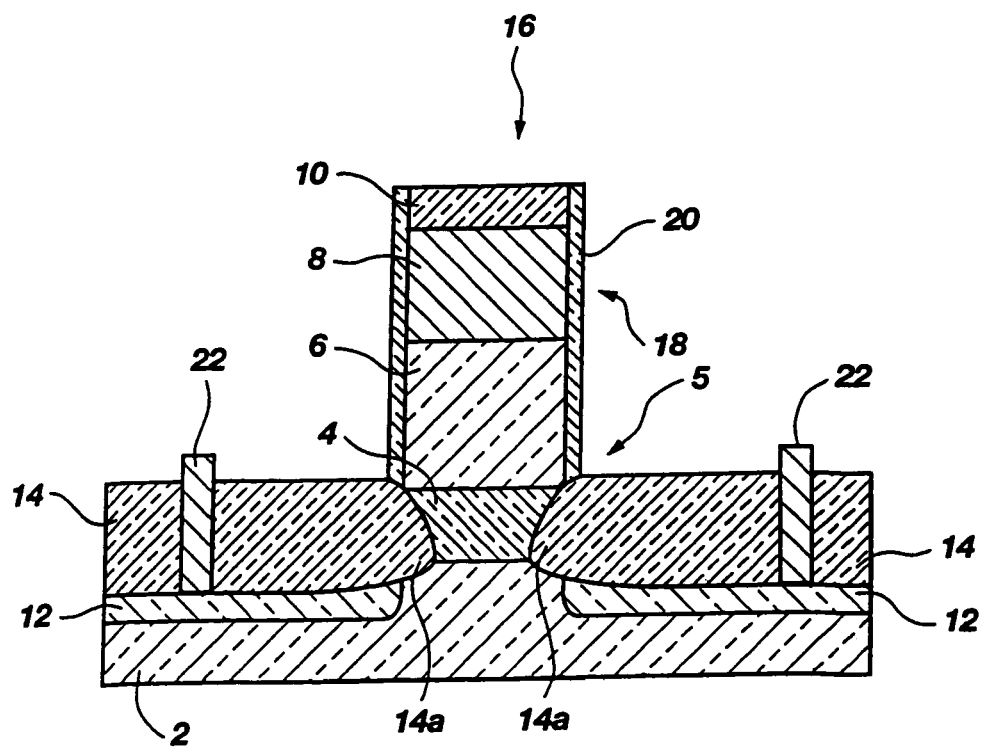

Next, as illustrated in FIG. 3, oxide layer 14, which is thicker than dielectric layer 4, is formed on the upper surface of diffusion regions 12. Any suitable process for forming oxide layer 14 of a high quality with little to no contamination with impurities can be employed in the present invention. Preferably, oxide layer 14 is formed by a vertical ion-assisted bombardment method.

In a preferred vertical ion-assisted bombardment (VIAB) method, oxide layer 14 is formed by re-oxidizing oxide layer 3. During the etching process used to fabricate gate structure 16 and the doping or implanting process used to form diffusion regions 12, oxide layer 3 is damaged. Thus, damaged oxide layer 3 is re-oxidized to form oxide layer 14 to repair this damage. The re-oxidation is preferably performed by "vertical" ion-bombardment, meaning that ions vertically bombard oxide layer 3 in the process of forming oxide layer 14, with little to no ion-bombardment of sidewalls 18 of gate structure 16. Thus, the only oxidation occurring is the re-oxidation of oxide layer 3, with little to no oxidation of sidewalls 18. This re-oxidation is "ion-assisted" bombardment, meaning that ions bombard the oxygen in oxide layer 3 and give the oxygen the necessary energy to re-oxidize and form oxide layer 14. In contrast, in high-temperature oxidation methods, the energy for oxide growth is derived from the higher temperatures.

This VIAB method is performed in an atmosphere containing at least one oxidant and hydrogen. The oxidant may be any gas containing oxygen, such as oxygen ($O_2$), water ($H_2O$), ozone ($O_3$), or hydrogen peroxide ($H_2O_2$), or a mixture thereof. Preferably, water is employed as the oxidant in the present invention. Any concentration of the oxidant can be used, provided it sufficiently re-oxidizes oxide layer 3 with the desired selectivity (e.g., forms oxide layer 14 to the desired thickness without oxidizing sidewalls 18). For example, the flow of water in the atmosphere can range from about 1 to about 500 sccm, and preferably is about 50 sccm.

The atmosphere also contains hydrogen as well as at least one oxidant. Hydrogen is included in the ambient because hydrogen helps reduce oxide growth on sidewalls 18 during the VIAB process. Any concentration of hydrogen can be used in the ambient, provided it sufficiently prevents oxide growth on sidewalls 18. For example, the flow of hydrogen in the ambient can range from about 1 to about 200 sccm, and is preferably about 10 sccm.

The ambient also contains a source for the inert ions which are used in the bombardment process. Any suitable source for the inert ions can be used, such as KR, He, or Ar gas. Preferably, argon gas is used as the source of the inert ions.

The VIAB method is performed at a temperature sufficient to provide the desired selectivity. The temperature should be kept as low as possible to avoid imparting more energy than necessary to the oxygen used to form oxide layer 14. More energy imparted to the oxygen via a higher temperature results in more oxide growth on sidewalls 18. The temperature in the preferred VIAB method can range from about 25° C. to about 700° C., and preferably is about 400° C.

The VIAB method of the present invention is performed for a time sufficient to grow the desired thickness of oxide layer 14 without growing an oxide layer on sidewalls 18. For example, to obtain an oxide layer 14 thickness of about 50 Å to about 100 Å, the length of the preferred VIAB process can range from about 5 minutes to about 500 minutes. Preferably, for such a thickness of oxide layer 14, the length of the preferred VIAB process is about 100 minutes.

The VIAB process is performed at an energy sufficient to excite the inert ions and impart the necessary energy to the oxygen and grow oxide layer 14 to the desired thickness. Preferably, the energy may range from 1 to about 300 eV, and more preferably is about 100 eV.

FIG. 3 depicts the device after the VIAB method is complete. Oxide layer 14 has been grown on the surface of semiconductor substrate 2 above diffusion regions 12. As illustrated in FIG. 3, the re-oxidation process also grows the oxide layer laterally under gate structure 16, thereby forming oxide layer 14 with regions 14a underlying dielectric layer 4. These underlying oxide regions 14a help decrease the sharpness of corners 5 at the interface of semiconductor substrate 2 and dielectric layer 4 and, therefore, reduce current leakage from gate structure 16 to the source and drain regions. The thickness and lateral growth of underlying oxide regions 14a depend on the thickness of dielectric layer 4, the thickness of oxide layer 14, and the parameters of the VIAB process. For example, the thickness of underlying oxide regions 14a can range from about 30 Å to about 80 Å and the lateral growth can range from about 5 Å to about 80 Å when the oxide layer 14 is grown to a thickness ranging from about 50 Å to about 100 Å by a VIAB process for about 100 minutes at a temperature of about 400° C. with an energy of about 100 eV using argon ions.

Since the VIAB process proceeds via vertical ion bombardment, it is desired that little to no lateral oxide growth occur on the sidewalls 18 of conductive layer 6 or second conductive layer 8. Accordingly, the parameters (e.g., time, temperature, energy, etc.) described above should be selected to minimize this lateral growth when possible. Preferably, this lateral growth during the VIAB process may be up to about 100 angstroms. More preferably, this lateral growth during the VIAB process is about 10 angstroms.

Subsequent processing steps can then be undertaken to form the desired IC device. For example, dielectric sidewall spacers 20 for gate structure 16 can be formed, contact holes can be formed in oxide layer 14, and a patterned metal layer 22 can be formed to achieve desired metal contacts.

While the preferred embodiments of the present invention have been described above, the invention defined by the appended claims is not to be limited by particular details set forth in the above description, as many apparent variations thereof are possible without departing from the spirit or scope thereof.

What is claimed is:

1. An oxidation method, comprising:
   providing a semiconductor substrate including silicon oxide on a portion of a surface thereof; and
   bombarding at least one of oxygen atoms of the silicon oxide and oxygen atoms proximate to the silicon oxide with at least one inert ion in an atmosphere consisting essentially of the at least one ion of an inert atom, hydrogen, and at least one oxidant to energize the oxygen atoms and to increase a thickness of the silicon oxide.

2. The oxidation method of claim 1, wherein providing the semiconductor substrate comprises providing a silicon substrate.

3. The oxidation method of claim 1, further comprising:
   forming the silicon oxide.

4. The oxidation method of claim 1, wherein bombarding comprises bombarding a region of the silicon oxide with krypton, helium, or argon ions.

5. The oxidation method of claim 1, wherein bombarding is effected in the presence of at least one oxidant comprising at least one of oxygen, water, ozone, and hydrogen peroxide.

6. The oxidation method of claim 5, wherein bombarding is effected in the presence of at least water and the hydrogen results from oxidizing effected with the water.

7. The oxidation method of claim 1, wherein bombarding is effected at a temperature of about 25° C. to about 700° C.

8. The oxidation method of claim 1, wherein bombarding is effected for a duration of from about 5 minutes to about 500 minutes.

9. The oxidation method of claim 1, wherein bombarding is effected at an energy of from about 1 eV to about 300 eV.

10. The oxidation method of claim 1, further comprising:
    forming at least one diffusion region in the semiconductor substrate beneath the silicon oxide.

11. The oxidation method of claim 10, wherein forming is effected before the bombarding.

12. The oxidation method of claim 1, wherein bombarding comprises vertical ion bombardment.

13. The oxidation method of claim 1, wherein providing comprises providing a semiconductor substrate with a damaged silicon oxide region.

14. The oxidation method of claim 1, including flowing the hydrogen through the atmosphere at a rate ranging from about 1 sccm to about 200 sccm.

15. The oxidation method of claim 1, bombarding is effected with the hydrogen present in the atmosphere in a concentration sufficient to passivate growth of oxide on surfaces that are substantially parallel to a direction of bombardment.

16. An oxidation method, comprising:
    providing a semiconductor device structure comprising:
        a semiconductor substrate with at least one diffusion region formed therein;
        silicon oxide positioned on the semiconductor substrate and over the at least one diffusion region; and
        a structure positioned on the semiconductor substrate, laterally adjacent to the at least one diffusion region; and
    bombarding oxygen atoms located substantially over the at least one diffusion region with at least one ion of an inert atom in an atmosphere consisting essentially of the at least one ion, hydrogen, and at least one oxidant.

17. The oxidation method of claim 16, wherein bombarding increases a thickness of the silicon oxide without substantially oxidizing the structure.

18. The oxidation method of claim 16, wherein providing the semiconductor device structure comprises providing a semiconductor device structure comprising a silicon substrate.

19. The oxidation method of claim 16, wherein providing the semiconductor device structure comprises providing a semiconductor device structure with the structure comprising at least a portion of a transistor gate structure.

20. The oxidation method of claim 16, further comprising:
    oxidizing the semiconductor substrate to form the silicon oxide.

21. The oxidation method of claim 16, wherein bombarding comprises bombarding the oxygen atoms with krypton, helium, or argon ions.

22. The oxidation method of claim 16, wherein bombarding is effected in the presence of at least one oxidant comprising at least one of oxygen, water, ozone, and hydrogen peroxide.

23. The oxidation method of claim 22, wherein bombarding is effected in the presence of at least water, and the hydrogen results from oxidizing effected with the water.

24. The oxidation method of claim 16, wherein bombarding is effected at a temperature of from about 25° C. to about 700° C.

25. The oxidation method of claim 16, wherein bombarding is effected for a duration of about 5 minutes to about 50 minutes.

26. The oxidation method of claim 16, wherein bombarding is effected at an energy of from about 1 eV to about 300 eV.

27. The oxidation method of claim 16, wherein bombarding comprises vertical ion bombardment.

28. The oxidation method of claim 16, wherein providing the semiconductor substrate comprises providing a semiconductor substrate having a region of damaged silicon oxide on a surface thereof.

29. The oxidation method of claim 16, including flowing the hydrogen into the atmosphere at a rate ranging from about 1 sccm to about 200 sccm.

30. The oxidation method of claim 16, wherein bombarding is effected with the hydrogen present in the atmosphere in a concentration sufficient to passivate the growth of oxide on surfaces substantially parallel to a direction of bombardment.

* * * * *